United States Patent
Chun (10) Patent No.: US 7,463,053 B2
(45) Date of Patent: Dec. 9, 2008

(54) SEMICONDUCTOR MEMORY DEVICE FOR INTERNALLY CONTROLLING STRENGTH OF OUTPUT DRIVER

(75) Inventor: Jun-Hyun Chun, Ichon-shi (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 12/071,838

(22) Filed: Feb. 27, 2008

(65) Prior Publication Data

US 2008/0150582 A1 Jun. 26, 2008

Related U.S. Application Data

(63) Continuation of application No. 11/176,394, filed on Jul. 8, 2005, now Pat. No. 7,355,448.

(30) Foreign Application Priority Data

Mar. 31, 2005 (KR) ............... 2005-0027384

(51) Int. Cl.
*H03K 19/0175* (2006.01)
(52) U.S. Cl. ............... 326/30; 326/86; 365/189.05; 327/108
(58) Field of Classification Search .......... 326/82, 326/83, 86, 87; 327/31, 34, 108, 109; 365/189.05
See application file for complete search history.

(56) References Cited

U.S. PATENT DOCUMENTS 5,635,776 A 6/1997 Imi

| | | | |
|---|---|---|---|
| 6,549,036 B1 * | 4/2003 | Lee | 326/83 |
| 6,667,633 B2 | 12/2003 | Fifield et al. | |
| 7,019,556 B2 | 3/2006 | Yoo | |
| 7,151,392 B2 | 12/2006 | Lee | |
| 2005/0248375 A1 | 11/2005 | Jung | |

FOREIGN PATENT DOCUMENTS

| | | |
|---|---|---|
| JP | 2002-094366 | 3/2002 |
| KR | 10-2004-0089434 | 10/2004 |
| KR | 10-2005-0022163 | 3/2005 |
| KR | 10-2005-0105587 | 11/2005 |

\* cited by examiner

*Primary Examiner*—James H. Cho
*Assistant Examiner*—Crystal L Hammond
(74) *Attorney, Agent, or Firm*—McDermott Will & Emery LLP (57) ABSTRACT

Provided is a semiconductor memory device that is capable of internally controlling a strength of an output driver. The semiconductor memory device includes: an OCD (off chip driver) control signal generator for decoding EMRS and addresses to generate a plurality of external strength control signals or an internal driving signal; a self control signal generator for detecting a level of a driving voltage to generate a plurality of internal strength control signals in response to the internal driving signal; a control signal generator for generating a strength control signal in response to the external strength control signals or the internal strength control signals; and a data output driver for outputting data, the strength of the data output driver being controlled according to the strength control signal.

5 Claims, 8 Drawing Sheets

SEMICONDUCTOR MEMORY DEVICE FOR INTERNALLY CONTROLLING STRENGTH OF OUTPUT DRIVER

RELATED APPLICATIONS

This application is a Continuation of U.S. application Ser. No. 11/176,394, filed Jul. 8, 2005 now U.S. Pat. No. 7,355,448, claiming priority of Korean Application No. 2005-0027384, filed Mar. 31, 2005, the entire contents of each of which are hereby incorporated by reference.

FIELD OF THE INVENTION

The present invention relates to a semiconductor design technology; and, more particularly, to a semiconductor memory device that is capable of internally controlling strength of an output driver.

DESCRIPTION OF RELATED ART

Figure 1:
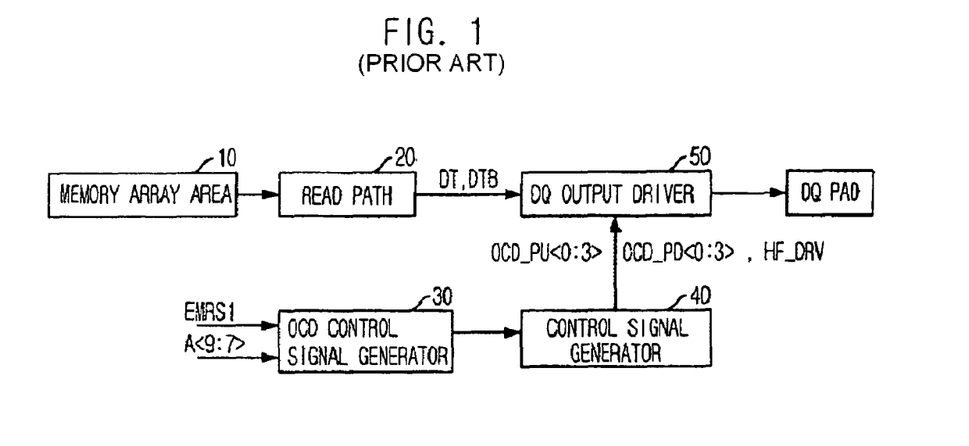
FIG. 1 is a block diagram of a conventional semiconductor memory device.

FIG. 1 is a block diagram of a conventional memory device.

Referring to FIG. 1, the conventional memory device includes: a memory array area 10 for storing data; a read path 20 through which data outputted from the memory array area 10 passes in response to a read command; an OCD control signal generator 30 for decoding an extended mode register set (EMRS) signal EMRS1 and addresses A<7:9> to generate a plurality of driving control signals; a control signal generator 40 for generating a plurality of strength control signals OCD_PU<0:3> and OCD_PD<0:3> for controlling the strength of the driver according to a plurality of strength control signals PU_INC, PU_DEC, PD_INC and PD_DEC; and a DQ output driver 50 for outputting data passing through the read path 20 to DQ pad at the strength that is controlled depending on the strength control signals OCD_PU<0:3> and OCD_PD<0:3>.

The strength of the DQ output driver 50 is controlled by the EMRS signal EMRS1 and the addresses A<7:9>. In more detail, when the OCD control signal generator 30 generates a plurality of strength control signals by decoding the EMRS signal EMRS1 and the addresses A<7:9>, the control signal generator 40 generates strength control signals OCD_PU<0:3> and OCD_PD<0:3> according to the strength control signals. In this manner, the strength of the DQ output driver 50 is controlled.

In case where an external device adopts an OCD scheme, the external device using a semiconductor memory device detects a level of a driving voltage and inputs the EMRS signal and the addresses.

Meanwhile, in case where an external device does not support an OCD scheme, the EMRS signal and the addresses are not inputted. Therefore, the conventional semiconductor memory device cannot output the data at a strength controlled according to a driving voltage. Consequently, when a level of the driving voltage falls down, a high frequency operation is impossible and thus an operation of the semiconductor memory device is unstable.

SUMMARY OF THE INVENTION

It is, therefore, an object of the present invention to provide a semiconductor memory device that is capable of internally controlling a strength of an output driver.

In an aspect of the present invention, there is provided a semiconductor memory device including: an OCD (off chip driver) control signal generator for decoding EMRS and addresses to generate a plurality of external strength control signals or an internal driving signal; a self control signal generator for detecting a level of a driving voltage to generate a plurality of internal strength control signals in response to the internal driving signal; a control signal generator for generating a strength control signal in response to the external strength control signals or the internal strength control signals; and a data output driver for outputting data, the strength of the data output driver being controlled according to the strength control signal.

In another aspect of the present invention, there is provided a semiconductor memory device including: an external strength controller for generating a first strength control signal for controlling a strength of a driver according to EMRS and addresses; an internal strength controller for generating a second strength control signal for controlling the strength of the driver by internally detecting and discerning a level of a driving voltage in response to an internal driving signal; and a data output driver for outputting data, the strength of the data output driver being controlled according to the first and second strength control signals.

Preferably, the self control signal generator includes: a level detecting unit for detecting the level of the driving voltage; a sampling unit for sampling a plurality of detection signals outputted from the level detecting unit in response to the internal driving signal; and a pulse generating unit for outputting sampling detection signals of the sampling unit as pulse-type strength increase signals and strength decrease signals.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 2:
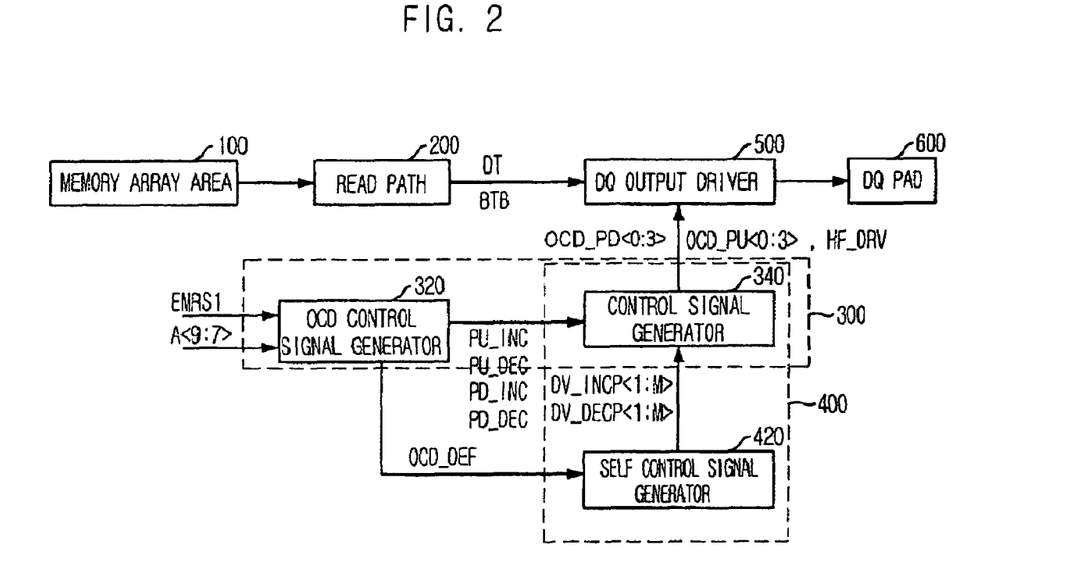
FIG. 2 is a block diagram of a semiconductor memory device in accordance with an embodiment of the present invention.

FIG. 2 is a block diagram of a semiconductor memory device in accordance with an embodiment of the present invention.

Referring to FIG. 2, the semiconductor memory device includes a memory array area 100 for storing data, a read path 200 through which data outputted from the memory array area 100 passes in response to a read command, an OCD control signal generator 320, a self control signal generator 420, a control signal generator 340, and a DQ output driver 500. The OCD control signal generator 320 decodes an EMRS signal EMRS1 and addresses A<7:9> to generate a plurality of external strength control signals PU_INC, PU_DEC, PD_INC and PD_DEC or an OCD internal driving signal OCD_DEF. The self control signal generator 420 detects a level of a driving voltage to generate a plurality of internal strength control signals DV_INCP<1:M> and DV_DECP<1:M> in response to the OCD internal driving signal OCD_DEF. The control signal generator 340 generates a plurality of strength control signals OCD_PU<0:3> and OCD_PD<0:3> for controlling a strength of the driver in response to the external strength control signals PU_INC, PU_DEC, PD_INC and PD_DEC or the internal strength control signals DV_INCP<1:M> and DV_DECP<1:M>. The DQ output driver 500 outputs the data passing through the read path 200 to the DQ pad 600 at the strength controlled according to the strength control signals OCD_PU<0:3> and OCD_PD<0:3>.

The control signal generator 340 receives the external strength control signals PU_INC, PU_DEC, PD_INC and PD_DEC or the internal strength control signals DV_INCP<1M> and DV_DECP<1:M> through a combinational logic circuit such as a logic gate. Therefore, the control signal generator 340 maintains the same circuit configuration and operation as the prior art.

This is because the external strength control signals PU_INC, PU_DEC, PD_INC and PD_DEC and the internal strength control signals DV_INCP<1:M> and DV_DECP<1:M> are signals that are generated so as to controlling the strength of the DQ output driver 500 according to the level of the driving voltage. Specifically, the external strength control signals PU_INC, PU_DEC, PD_INC and PD_DEC are generated by input signals of an external device. When the external strength control signals PU_INC, PU_DEC, PD_INC and PD_DEC are not generated, the internal strength control signals DV_INCP<1:M> and DV_DECP<1:M> are generated internally. Therefore, only one of those signals is activated depending on the external device.

Accordingly, even when the control signal generator 340 receives the external strength control signals PU_INC, PU_DEC, PD_INC and PD_DEC and the internal strength control signals DV_INCP<1:M> and DV_DECP<1:M> together, it can maintains the same circuit configuration and operation as the prior art.

Meanwhile, when the OCD control signal generator 320 and the self control signal generator 420 include the control signal generator separately, an external strength controller 300 is provided with the OCD control signal generator 320 and the control signal generator, and an internal strength controller 400 is provided with the self control signal generator 420 and the control signal generator.

At this time, the external strength controller 300 controls the strength of the DQ output driver 500 according to the input of the EMRS signal EMRS1 and the addresses A<7:9>. When the external strength controller 300 does not operate, the internal strength controller 400 controls the strength of the driver by internally detecting and discerning the level of the driving voltage VDD.

Like this, when the external and internal strength controllers 300 and 400 are provided separately, the DQ output driver 500 receives their output signals through a combinational logic circuit. Therefore, the DQ output driver 500 maintains the same circuit configuration and operation as the prior art. As described above, although the external and internal strength controllers 300 and 400 have the same operation, their driving timings are different.

The OCD control signal generator 320 is implemented with a decoder that decodes the EMRS signal EMRS1 and the addresses A<7:9> to generate the strength control signals PU_INC, PU_DEC, PD_INC and PD_DEC or the OCD internal driving signal OCD_DEF.

When the default EMRS signal EMRS1 and combination of the addresses A<7:9> are inputted, the self control signal generator 420 internally detects the level of the driving voltage VDD and controls the strength of the output driver. The process of internally controlling the strength of the output driver will be described below with reference to the accompanying drawings.

Figure 3:
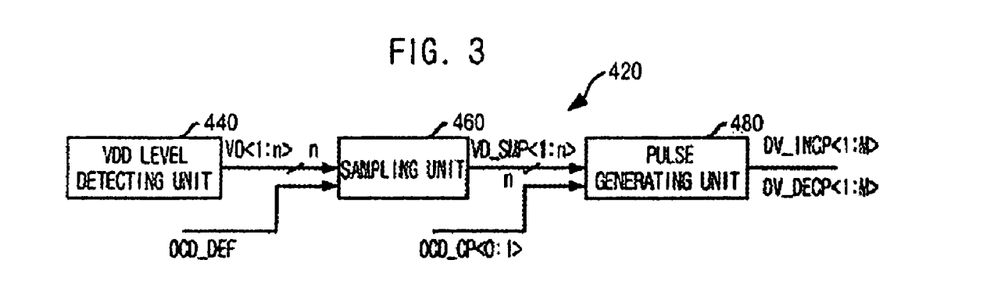
FIG. 3 is a block diagram of a self control signal generator shown in FIG. 2.

FIG. 3 is a block diagram of the self control signal generator shown in FIG. 2.

Referring to FIG. 3, the self control signal generator 420 includes a VDD level detecting unit 440 for detecting the level of the driving voltage VDD, a sampling unit 460 for sampling output signals VD<1:n> of the VDD level detecting unit 440 in response to the OCD internal driving signal OCD_DEF, and a pulse generating unit 480 for outputting sampling detection signals VD_SMP<1:n> of the sampling unit 460 as pulse-type strength increase signals DV_INCP<1:M> and strength decrease signals DV_DECP<1:M>.

The respective blocks of the self control signal generator 420 will be described below in detail with reference to the accompanying drawings.

Figure 4:
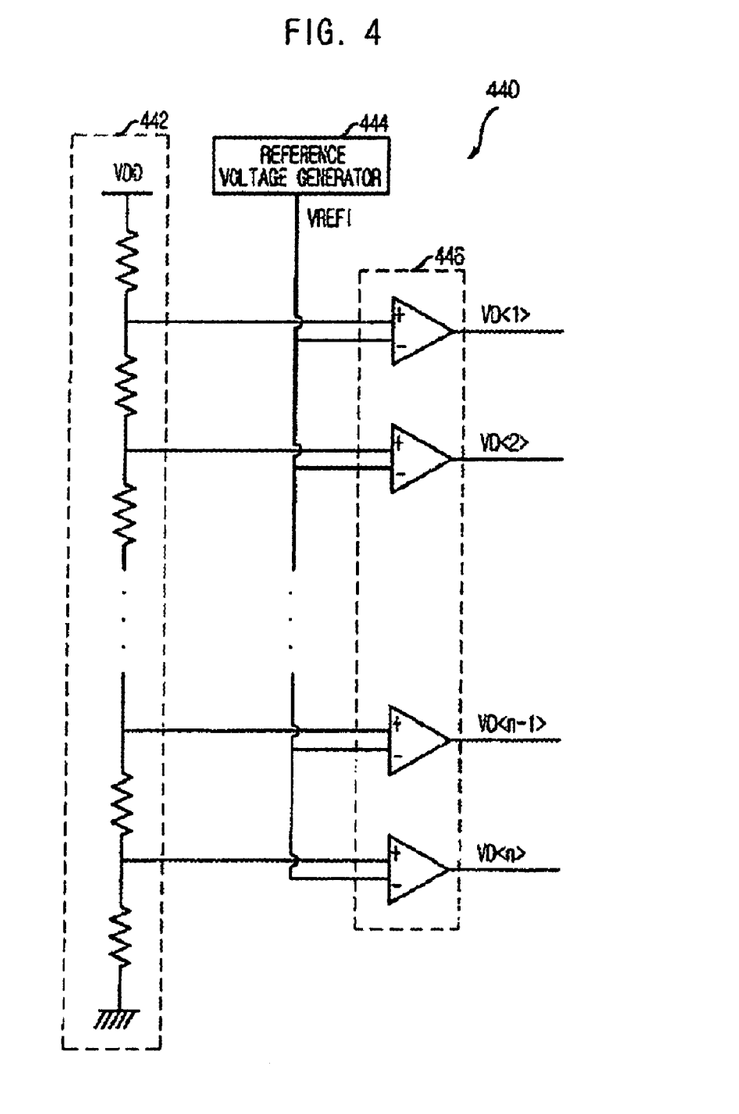
FIG. 4 is a circuit diagram of a VDD level detecting unit shown in FIG. 3.

FIG. 4 is a circuit diagram of the VDD level detecting unit shown in FIG. 3.

Referring to FIG. 4, the VDD level detecting unit 440 includes a voltage divider 442, a reference voltage generator 444, and a signal amplifier 446. The voltage divider 442 divides the driving voltage VDD into various voltage levels through resistors connected in series. The reference voltage generator 444 generates a reference voltage VREF1 as a reference of the driving voltage VDD. The signal amplifier 446 amplifies a difference between the respective outputs of the voltage divider 442 and the reference voltage VREF1 and generates a corresponding detection signal VD<1:n>.

Preferably, the signal amplifier 446 is implemented with a plurality of differential amplifiers receiving the outputs of the voltage divider 442 and the reference voltage VREF1 as the differential input.

When the level of the driving voltage VDD increases, the levels of the divided voltages outputted from the voltage divider 442 also increase. On the contrary, because the reference voltage VREF1 always maintains a constant level, the number of the output voltages of the voltage divider 442 having a voltage level higher than the reference voltage VREF1 increases. Accordingly, the number of detection signals having a positive (+) voltage level among the detection signals VD<1:n> increases.

On the contrary, when the level of the driving voltage decreases, the number of the output voltages of the voltage divider 442 having a voltage level higher than the reference voltage VREF1 decreases. Accordingly, the number of detection signals having a positive (+) voltage level among the detection signals VD<1:n> also decreases.

Like this, the VDD level detecting unit 440 increases the number of the detection signals VD<1:n> having the positive voltage level when the level of the driving voltage VDD increases, and it decreases the number of the detection signals VD<1:n> having the positive voltage level when the level of the driving voltage VDD decreases.

Figure 5:
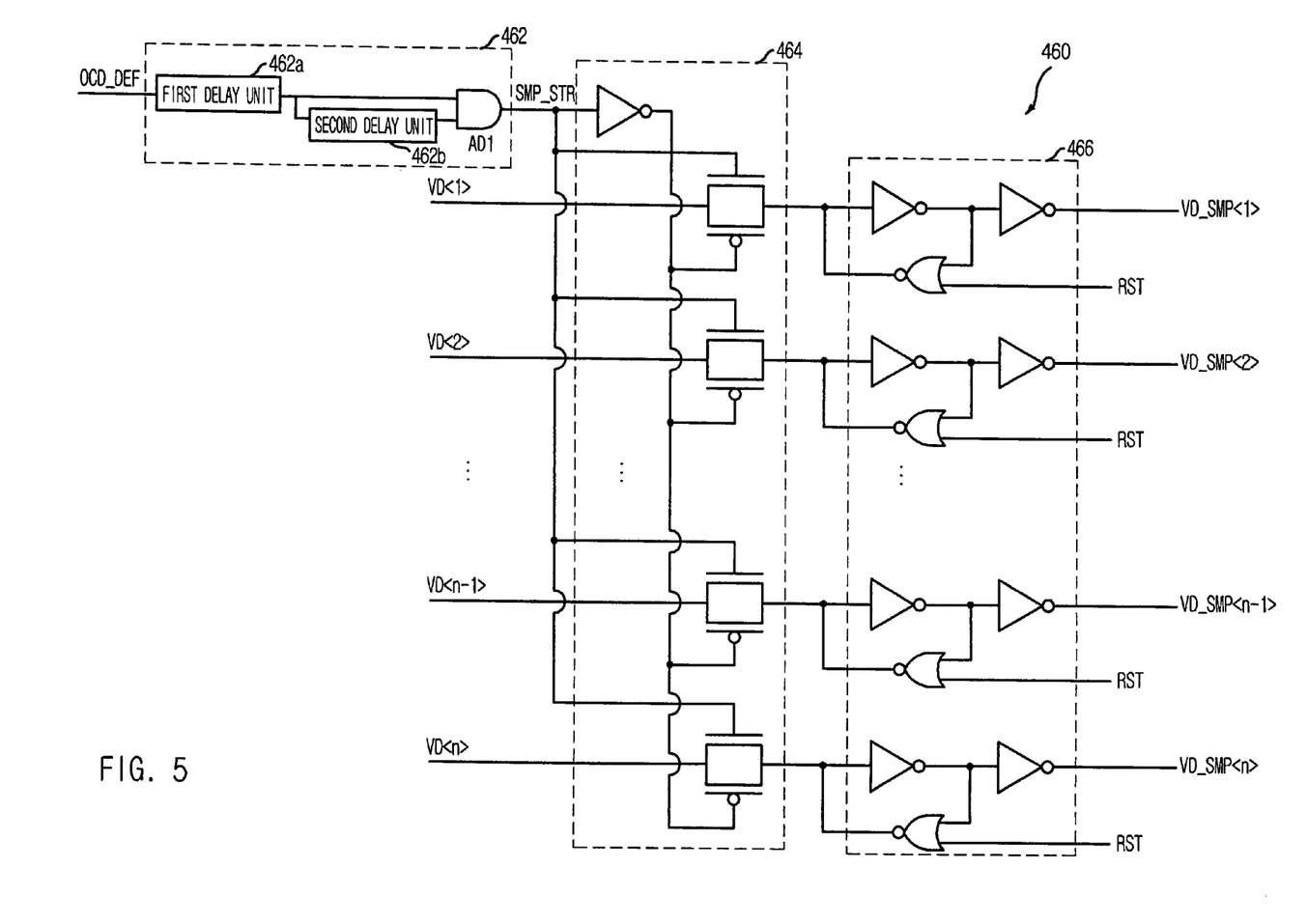
FIG. 5 is a circuit diagram of a sampling unit shown in FIG. 3.

FIG. 5 is a circuit diagram of the sampling unit shown in FIG. 3.

Referring to FIG. 5, the sampling unit 460 includes: a signal generator 462 for receiving the OCD internal driving signal OCD_DEF to generate a sampling start signal SMP_STR; a plurality of transfer gates 464 for transferring the detection signals VD<1:n> in response to the sampling start signal SMP_STR; and a plurality of latches 466, responsive to a reset signal RST, for resetting sampling detection signals VD_SMP<1:n> or latching output signals of the corresponding transfer gates to output the sampling detection signals VD_SMP<1:n>.

Also, the signal generator 462 includes a first delay unit 462a for delaying the OCD internal driving signal OCD_DEF, a second delay unit 462b for delaying an output signal of the first delay unit 462a, and an AND gate AD1 for receiving the output signal of the first delay unit 462a and an inverted output signal of the second delay unit 462b to output the sampling start signal SMP_STR.

Accordingly, the signal generator 462 activates the sampling start signal SMP_STR in response to the activation of the OCD internal driving signal OCD_DEF after a delay time of the first delay unit 462a. At this time, an activation pulse width of the sampling start signal SMP_STR is identical to a delay time of the second delay unit 462b.

An operation of the sampling unit 460 will be described below in brief.

When the OCD internal driving signal OCD_DEF is activated, the signal generator 462 activates the sampling start signal SMP_STR in response to the OCD internal driving signal OCD_DEF. Therefore, the detection signals VD<1:n> are outputted as the sampling detection signals VD_SMP<1:n> through the corresponding transfer gates and latches during the activation of the sampling start signal SMP_STR.

That is, when the OCD internal driving signal OCD_DEF is activated, the sampling unit 460 outputs the corresponding detection signals VD<1:n> as the sampling detection signals VD_SMP<1:n> after the delay time of the first delay unit 462a.

Figure 6:
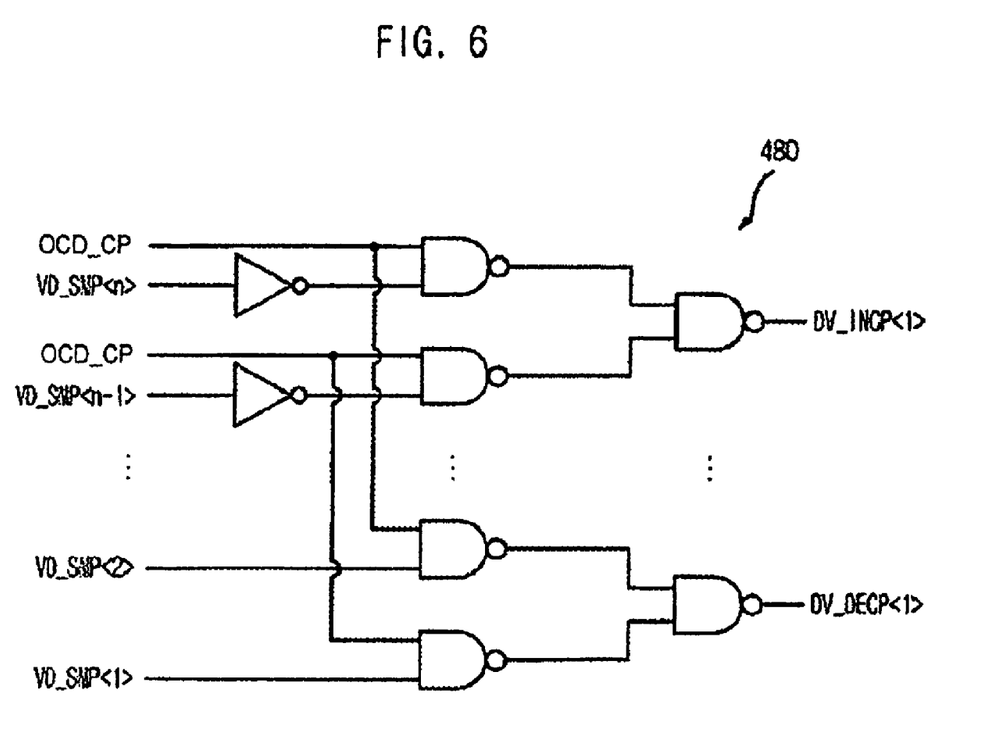
FIG. 6 is a circuit diagram of a pulse generating unit shown in FIG. 3.

FIG. 6 is a circuit diagram of the pulse generating unit shown in FIG. 3.

Referring to FIG. 6, the pulse generating unit 480 is configured with combinations of logic gates and generates the sampling detection signals VD_SMP<1:n> as the pulse-type strength increase signals DV_INCP<1:M> and the pulse-type strength decrease signals DV_DECP<1:M> in response to pulse generation signals OCD_CP<0:1> that are activated after a predetermined time from the activation of the OCD internal driving signal OCD_DEF.

Figure 7:
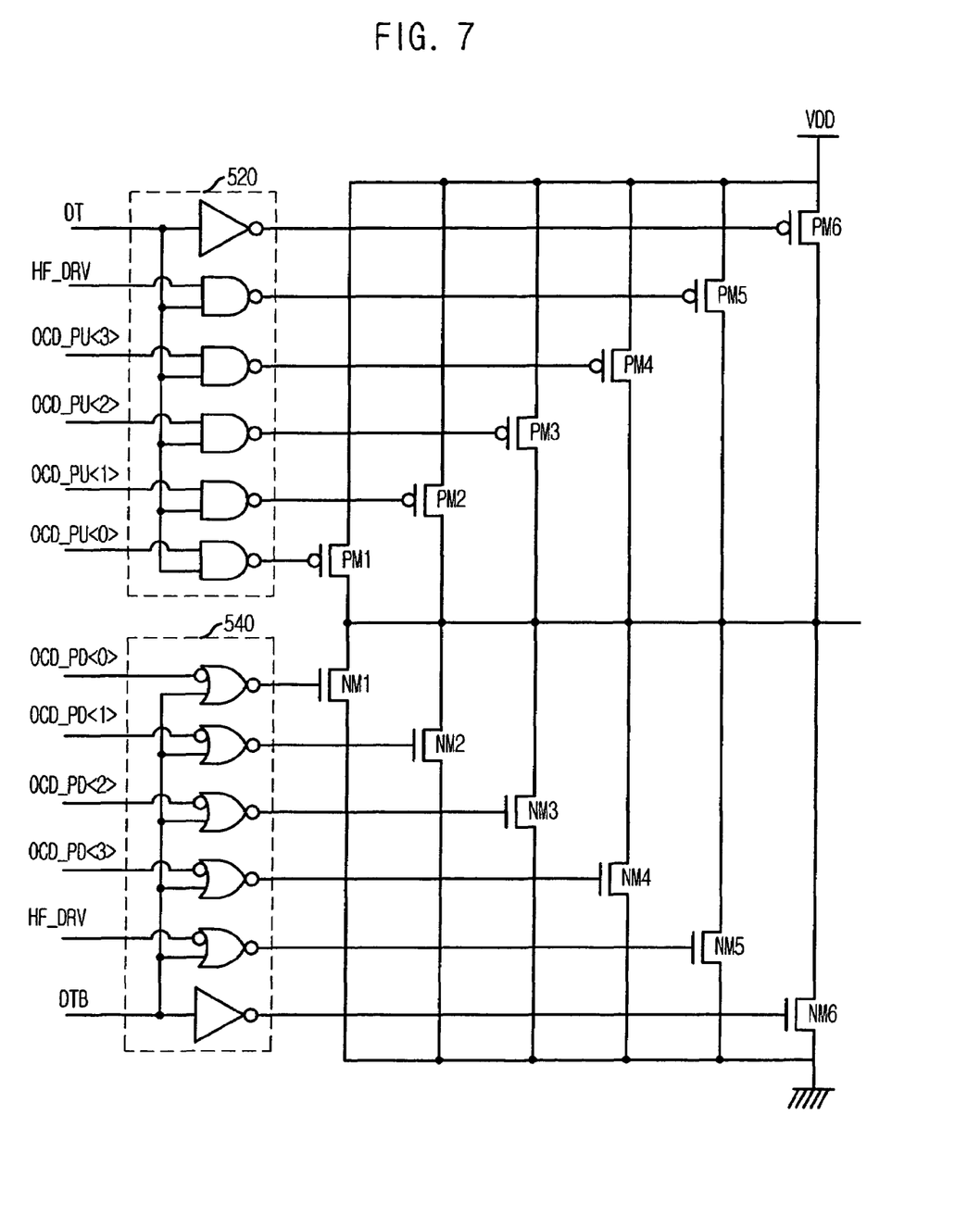
FIG. 7 is a circuit diagram of a DQ output driver shown in FIG. 2.

FIG. 7 is a circuit diagram of the DQ output driver shown in FIG. 2.

Referring to FIG. 7, the DQ output driver 500 includes: first to sixth pull-up drivers PM1, PM2, PM3, PM4, PM5 and PM6 for driving the DQ pad 600 in response to first to sixth pull-up driving signals; first to sixth pull-down drivers NM1, NM2, NM3, NM4, NM5 and NM6 for driving the DQ pad 600 in response to first to sixth pull-down driving signals; a pull-up driving control unit 520 for outputting data DT as the first to sixth pull-up driving signals in response to a plurality of pull-up strength control signals OCD_PU<0:3> and HF_DRV; and a pull-down driving control unit 540 for outputting inverted data DTB as the first to sixth pull-down driving signals in response to a plurality of pull-down strength control signals OCD_PD<0:3> and HF_DRV.

The DQ output driver 500 selectively activates some of the pull-up drivers PM1, PM2, PM3, PM4, PM5 and PM6 and the pull-down drivers NM1, NM2, NM3, NM4, NM5 and NM6 in response to the strength control signals OCD_PU<0:3> and OCD_PD<0:3> and HF_DRV. Therefore, the strength of the driver for driving the DQ pad 600 is controlled.

Figure 8:
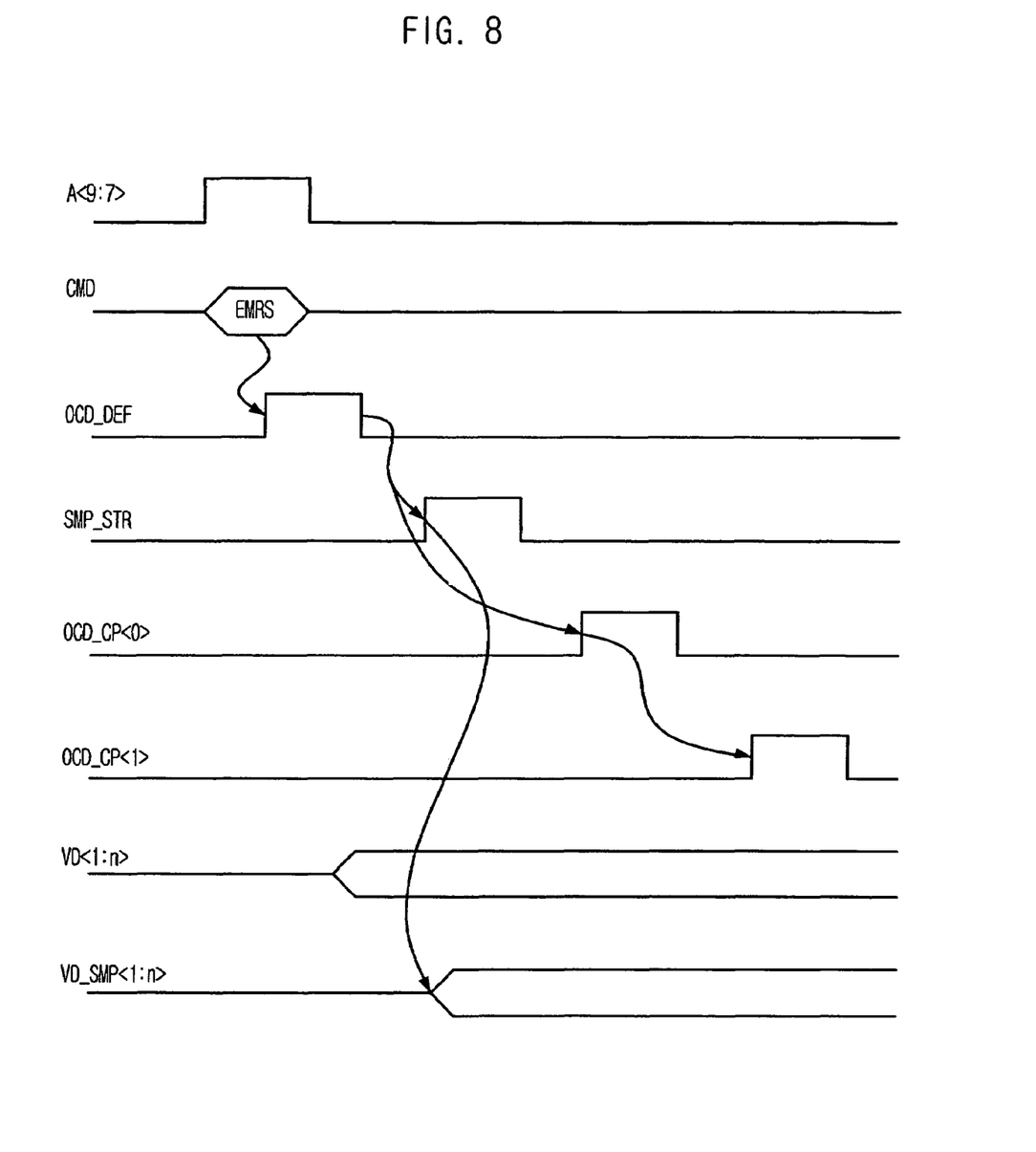
FIG. 8 is an operation waveform when the semiconductor memory device shown in FIG. 2 internally controls a strength of an output driver.

FIG. 8 is an operation waveform when the semiconductor memory device shown in FIG. 2 internally controls the strength of the output driver. A following table 1 shows the strength of the output driver according to the logic combination of the sampling detection signals VD_SMP<1:n> that are detected by the VDD level detecting unit 440 and the sampling unit 460.

TABLE 1

| VD_SMP | | | | | Strength of |
|---|---|---|---|---|---|
| <1> | <2> | <3> | <4> | <5> | Output Driver |
| H | L | — | — | L | 110% |
| H | H | — | — | L | 105% |
| H | H | — | — | L | 100% |
| H | H | — | H | H | 95% |
| H | H | — | H | H | 90% |

A process of internally controlling the strength of the output driver when the external device does not support the OCD scheme will be described below with reference to FIG. 8 and Table 1.

When the EMRS and addresses representing the default case are applied to the semiconductor memory device, the OCD control signal generator activates the OCD internal driving signal OCD_DEF.

When the VDD level detecting unit detects the level of the driving voltage and generates a plurality of detection signals, the sampling unit activates the sampling start signal after a predetermined time from the activation of the OCD internal driving signal and outputs the detection signals as the sampling detection signals.

The pulse generating unit generates a plurality of strength control signals OCD_PU<0:3>, OCD_PD<0:3> and HF_DRV in response to the pulse generation signals OCD_CP<0:1> that are activated after a predetermined time from the activation of the OCD internal driving signal, that is, later than the activation of the sampling start signal. At this time, the pulse generation signal OCD_CP<1> is activated later than the pulse generation signal OCD_CP<0>.

Accordingly, the DQ output driver 500 selectively activates some of the pull-up drivers PM1, PM2, PM3, PM4, PM5 and PM6 and the pull-down drivers NM1, NM2, NM3, NM4, NM5 and NM6 according to the strength control signals OCD_PU<0:3>, OCD_PD<0:3> and HF_DRV, so that the strength of the driver for driving the DQ pad 600 is controlled.

As shown in Table 1, the variation in the strength of the DQ output driver according to the sampling detection signals VD_SMP<1:5> is in the range from 110% to 90%. As the number of signals having the logic high level among the sampling detection signals VD_SMP<1:5> increase, the strength of the DQ output driver 500 decreases. As the number of signals having the logic high level decreases, the strength of the DQ output driver 500 increases.

Figure 9A:
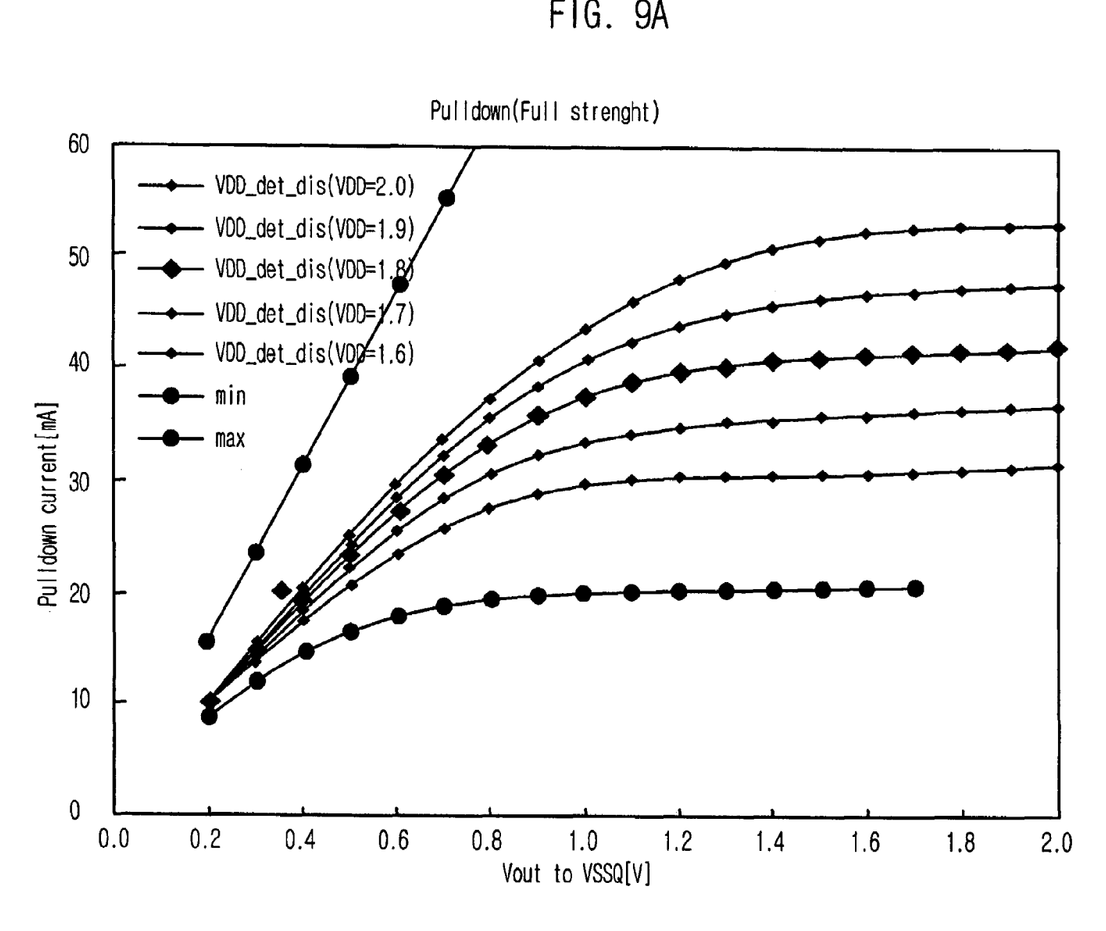
FIG. 9A is an operation waveform when an external device directly controls a strength of a DQ output driver through input of EMRS signal and addresses.

FIG. 9A is an operation waveform when the external device directly controls the strength of the DQ output driver through the input of the EMRS signal EMRS1 and the addresses A<7:9>.

Figure 9B:
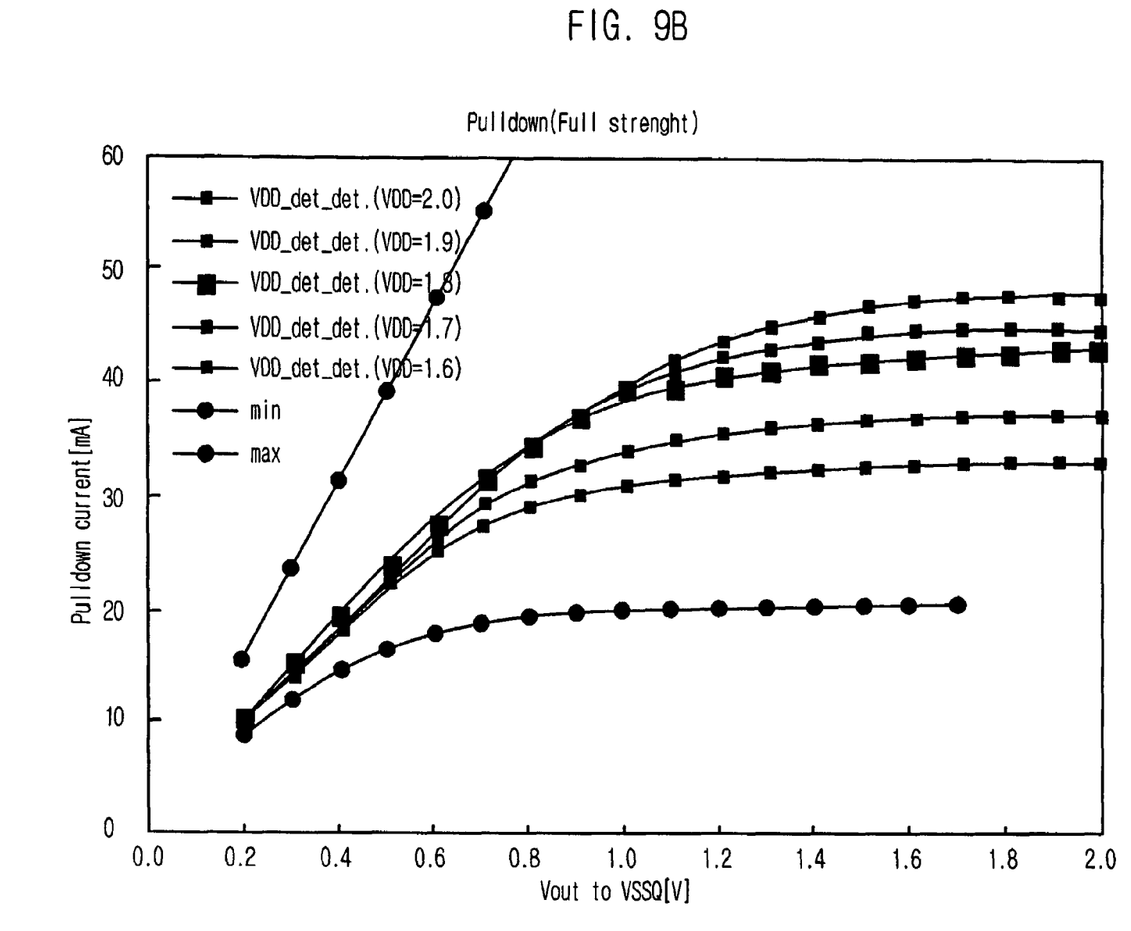
FIG. 9B is an operation waveform when an external device does not support an OCD scheme.

FIG. 9B is an operation waveform when the external device does not support the OCD scheme. The semiconductor memory device detects the level of the driving voltage VDD and internally controls the strength of the DQ output driver.

The case of FIG. 9B where the strength is internally controlled is driven equally to the case of FIG. 9A where the external device controls the strength.

In case where the default is applied as the EMRS and addresses, the level of the driving voltage is internally detected through the VDD level detecting unit of the self control signal generator and the internal strength control signals are generated through the sampling unit and the pulse generating unit. When the external strength control signals generated by the external input are applied, the strength control signal for controlling the strength of the output driver is outputted. Also, when the internal strength control signals are applied, the strength of the DQ output driver is controlled by the control signal generator that generates the strength control signals.

That is, even when the semiconductor memory device is used in the external device that does not support the OCD scheme, the self control signal generator can internally control the strength of the output driver. When the level of the driving voltage decreases, the strength of the output driver is increased. Therefore, the present invention can stably support the high frequency operation and thus improve the reliability of the semiconductor memory device.

As described above, in the case of the system that does not support the OCD, the strength of the output driver can be internally controlled by detecting the level of the driving voltage.

The present application contains subject matter related to Korean patent application No. 2005-27384, filed in the Korean Patent Office on Mar. 31, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

The invention claimed is:

1. A semiconductor memory device comprising:
an OCD (off chip driver) control signal generator for selectively generating a plurality of external strength control signals and an internal driving signal according to EMRS codes and input addresses wherein the external strength control signals is enabled during an OCD adjusting mode;
a self control signal generator for generating a plurality of internal strength control signals in response to the internal driving signal;
a control signal generator for generating a strength control signal in response to the external strength control signals or the internal strength control signals; and
a data output driver for outputting data, the strength of the data output driver being controlled according to the strength control signal.

2. The semiconductor memory device as recited in claim 1, wherein the self control signal generator includes:
a level detecting unit for detecting the level of the driving voltage;
a sampling unit for sampling a plurality of detection signals outputted from the level detecting unit in response to the internal driving signal; and
a pulse generating unit for outputting sampling detection signals of the sampling unit as pulse-type strength increase signals and strength decrease signals.

3. The semiconductor memory device as recited in claim 2, wherein the level detecting unit includes:
a voltage divider for dividing the driving voltage into various voltage levels through resistors connected in series;
a reference voltage generator for generating a reference voltage as a reference of the driving voltage; and
a signal amplifier for amplifying a difference between each output of the voltage divider and the reference voltage and generating the corresponding detection signals.

4. The semiconductor memory device as recited in claim 3, wherein the signal amplifier is implemented with a plurality of differential amplifiers receiving the outputs of the voltage divider and the reference voltage as differential input.

5. The semiconductor memory device as recited in claim 4, wherein the sampling unit includes:
a signal generator for receiving the internal driving signal to generate a sampling start signal;
a plurality of transfer gates for transferring the detection signals in response to the sampling start signal; and
a plurality of latches, responsive to a reset signal, for resetting the sampling detection signals or latching output signals of the corresponding transfer gates to output the sampling detection signals.

* * * * *